(12) United States Patent
Wang et al.

(10) Patent No.: US 12,733,296 B2
(45) Date of Patent: Sep. 8, 2026

(54) LIGHT-EMITTING DEVICE AND LIGHT-EMITTING APPARATUS

(71) Applicant: ANHUI SANAN OPTOELECTRONICS CO., LTD., Wuhu (CN)

(72) Inventors: Yu Wang, Wuhu (CN); Yung-ling Lan, Wuhu (CN); Mingbin Ma, Wuhu (CN); Chao Tang, Wuhu (CN); Hongmin Zhou, Wuhu (CN); Jinkuang Dong, Wuhu (CN); Cheng-hung Lee, Wuhu (CN); Chan-chan Ling, Wuhu (CN)

(73) Assignee: ANHUI SANAN OPTOELECTRONICS CO., LTD., Wuhu (CN)

( * ) Notice: Subject to any disclaimer, the term of this patent is extended or adjusted under 35 U.S.C. 154(b) by 412 days.

(21) Appl. No.: 18/410,675

(22) Filed: Jan. 11, 2024

(65) Prior Publication Data

US 2024/0355958 A1 Oct. 24, 2024

Related U.S. Application Data

(63) Continuation-in-part of application No. PCT/CN2021/106427, filed on Jul. 15, 2021.

(51) Int. Cl.
*H10H 20/81* (2025.01)
*H10H 20/812* (2025.01)
(Continued)

(52) U.S. Cl.
CPC ...... *H10H 20/8215* (2025.01); *H10H 20/812* (2025.01); *H10H 20/814* (2025.01);
(Continued)

(58) Field of Classification Search
CPC ....................... H10H 20/8215; H10H 20/8162
See application file for complete search history.

(56) References Cited

U.S. PATENT DOCUMENTS

2004/0166599 A1* 8/2004 Ishida .................. H10H 20/825 438/22
2015/0021652 A1* 1/2015 Ueta .................... H10H 20/817 257/103

FOREIGN PATENT DOCUMENTS

CN 1941442 A 4/2007
CN 101069289 A 11/2007
(Continued)

*Primary Examiner* — Michele Fan
(74) *Attorney, Agent, or Firm* — MUNCY, GEISSLER, OLDS & LOWE, P.C.

(57) ABSTRACT

This disclosure provides a light-emitting device comprising a semiconductor laminate. The semiconductor laminate includes an n-type semiconductor layer, a p-type semiconductor layer disposed on the n-type semiconductor layer, and an active layer disposed between the n-type and p-type semiconductor layers. The active layer has a first surface proximate to the n-type semiconductor layer and a second surface proximate to the p-type semiconductor layer. The p-type semiconductor layer has a third surface proximate to and a fourth surface distal to the n-type semiconductor layer. The semiconductor laminate further includes hydrogen impurities with a concentration distribution along a thickness direction from the n-type to the p-type semiconductor layers. The concentration distribution has a first peak value at a first location proximate to a second peak value at a second location distal to the active layer. The second peak value is greater than the first peak value.

20 Claims, 3 Drawing Sheets

(51) Int. Cl.
*H10H 20/814* (2025.01)
*H10H 20/815* (2025.01)
*H10H 20/816* (2025.01)
*H10H 20/825* (2025.01)
*H10H 20/833* (2025.01)

(52) U.S. Cl.
CPC ...... *H10H 20/815* (2025.01); *H10H 20/8162* (2025.01); *H10H 20/825* (2025.01); *H10H 20/833* (2025.01)

(56) References Cited

FOREIGN PATENT DOCUMENTS

| | | | |
|---|---|---|---|
| CN | 108598224 | A | 9/2018 |
| CN | 111403565 | A | 7/2020 |

* cited by examiner

LIGHT-EMITTING DEVICE AND LIGHT-EMITTING APPARATUS

CROSS-REFERENCE TO RELATED APPLICATION

This application is a continuation-in-part (CIP) of International Application No. PCT/CN2021/106427, filed on Jul. 15, 2021, and incorporated by reference herein in its entirety.

FIELD

This disclosure relates to a light-emitting device and a light-emitting apparatus.

BACKGROUND

In recent years, the advancement of light emitting diode (LED) technology has brought great improvements in light-emitting efficiency and LEDs have found versatile applications in various fields, from laser pointer to lighting, etc., greatly increasing the applicable range thereof. In addition, LEDs have the advantages of small size, long lifespan, low environmental pollution, and low cost, as well as better color saturation and dynamic color control, thereby allowing LED-related technology to be the most anticipated technological field.

SUMMARY

Therefore, an object of the disclosure is to provide a light-emitting device that has high light-emitting efficiency, and a light-emitting apparatus including the same.

According to one aspect of the disclosure, the light-emitting device includes a semiconductor laminate. The semiconductor laminate includes an n-type semiconductor layer, a p-type semiconductor layer disposed on the n-type semiconductor layer, and an active layer disposed between the n-type semiconductor layer and the p-type semiconductor layer. The active layer has a first surface proximate to the n-type semiconductor layer and a second surface proximate to the p-type semiconductor layer. The p-type semiconductor layer has a third surface proximate to the n-type semiconductor layer and a fourth surface distal to the n-type semiconductor layer. The semiconductor laminate further includes hydrogen impurities with a concentration distribution along a thickness direction from the n-type semiconductor layer to the p-type semiconductor layer. The concentration distribution has a first peak value at a first location proximate to the active layer and a second peak value at a second location distal to the active layer. The second peak value is greater than the first peak value.

According to another aspect of the disclosure, the lighting apparatus includes the light-emitting device according to the disclosure.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
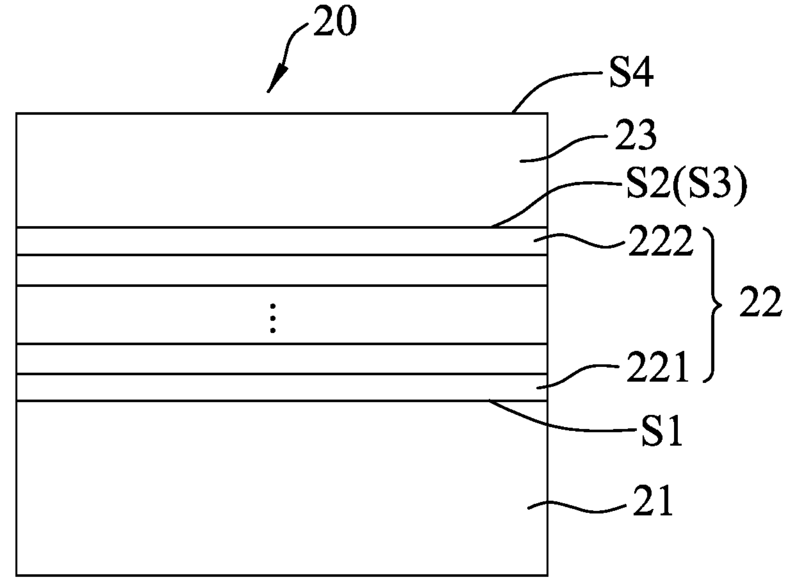
FIG. 1 is a schematic cross-sectional view illustrating an embodiment of a light-emitting device according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

The composition and dopants in each layer in the light-emitting device of this disclosure can be analyzed by any suitable technique, such as secondary ion mass spectrometer (SIMS).

The thickness of each layer included in the semiconductor device of this disclosure may be analyzed by any suitable technique, such as transmission electron microscopy (TEM) or scanning electron microscope (SEM), measurements by which, in conjunction with the SIMS spectrum, may correlate depth positioning with elemental composition analysis.

In this disclosure, the term "peak value" refers to a maximum value around a peak point of the curve where the slope of the curve transitions from positive to negative, if not otherwise specified. Likewise, the term "minimum value" refers to a lowest value around a valley point where the slope of the curve transitions from negative to positive.

FIG. 1 is a schematic cross-sectional view illustrating an embodiment of a light-emitting device according to the disclosure.

The light-emitting device includes a semiconductor laminate 20. The semiconductor laminate 20 includes an n-type semiconductor layer 21, an active layer 22, and a p-type semiconductor layer 23. The active layer 22 is disposed between the n-type semiconductor layer 21 and the p-type semiconductor layer 23. The n-type semiconductor layer 21 is doped with an n-type dopant and provides electrons. The p-type semiconductor layer 23 is disposed on the n-type semiconductor layer 21, is doped with a p-type dopant, and provides holes. In the active layer 22, electrons and holes recombine to emit light.

The active layer 22 has two opposite surfaces, which are a first surface (S1) proximate to the n-type semiconductor layer 21 and a second surface (S2) proximate to the p-type semiconductor layer 23. The p-type semiconductor layer 23 has two opposite surfaces, which are a third surface (S3) proximate to the n-type semiconductor layer 21 and a fourth surface (S4) distal to the n-type semiconductor layer 21. In some embodiments, the p-type semiconductor layer 23 may be in direct contact with the active layer 22 and the second surface S2 and the third surface S3 may converge. In some other embodiments, the p-type semiconductor layer 23 and the active layer 22 may not be in direct contact with each other, and the second surface (S2) and the third surface (S3) may be distinct and spaced apart. In the present embodiment, the second surface (S2) and the third surface (S3) are in direct contact and converge.

Figure 2:
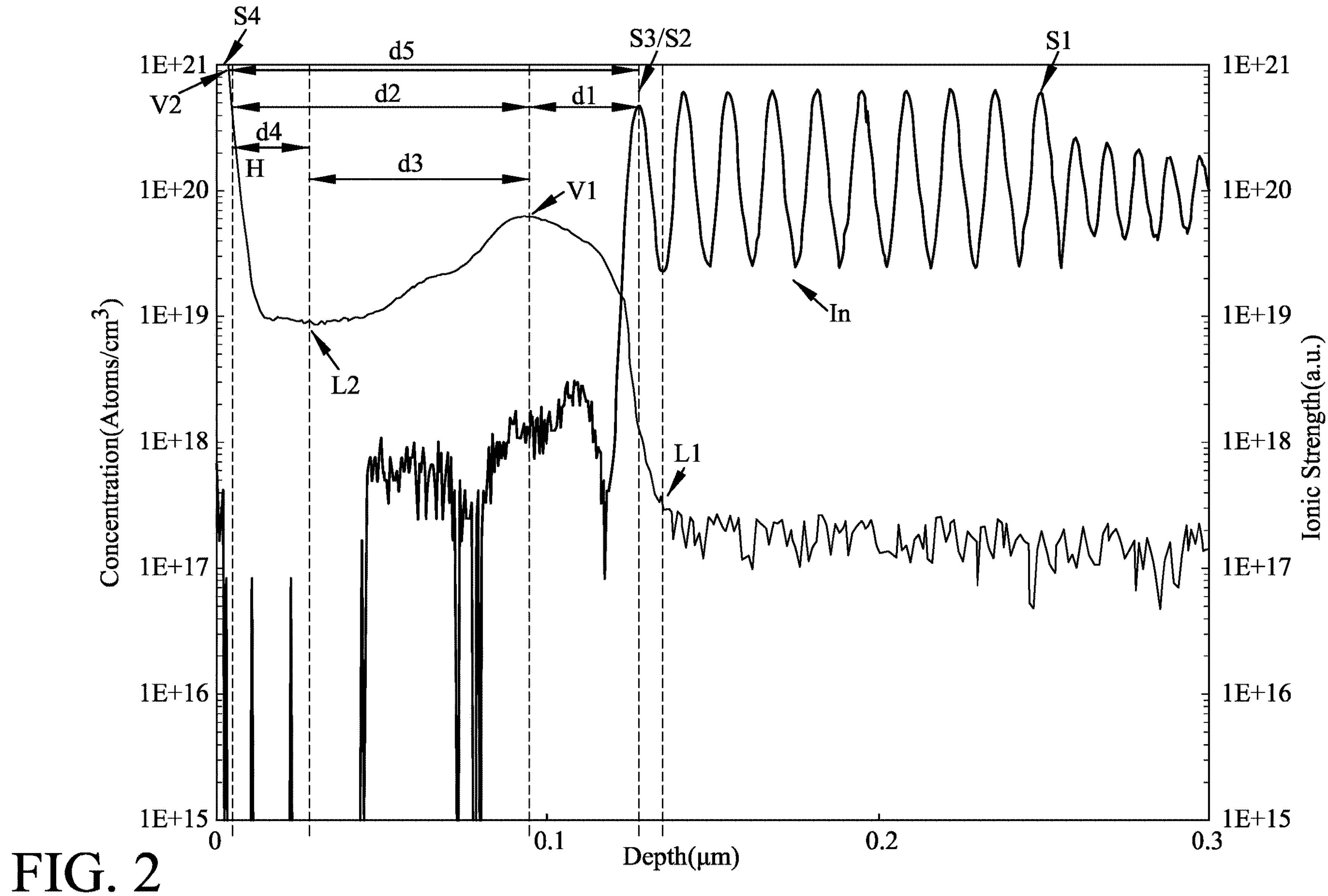
FIG. 2 is a plot showing relation between concentration distribution/ionic strength of hydrogen (H) and depth in a portion of the light-emitting device in FIG. 1.

In addition, referring to FIG. 2, the semiconductor laminate 20 further includes hydrogen impurities (H) between the first surface (S1) and the fourth surface (S4) with a concentration distribution along a thickness direction from the n-type semiconductor layer 21 to the p-type semiconductor layer 23. When analyzed with SIMS, signals for hydrogen impurities (H) appear from a location proximate to the second surface (S2), and can be detected in all the layers above the active layer 22. That is, the signals for hydrogen impurities (H) can be detected throughout the p-type semiconductor layer 23.

The elemental composition of the light-emitting device according to the disclosure is analyzed by SIMS. The light-emitting device of this disclosure was detected to have hydrogen impurities (H) and the Group IIIA element indium (In). The concentration distribution of hydrogen impurities (H) may be represented as a curve in the SIMS spectrum as shown in FIG. 2. It is noted that, other elements in addition to indium (In), such as nitrogen (N), gallium (Ga), aluminum (Al), and silicon, may also be included in the light-emitting device; however, these are not shown in FIG. 2.

The concentration distribution of the hydrogen impurities (H) has a first peak value (V1) at a first location proximate to the active layer 22 and a second peak value (V2) at a second location distal to the active layer 22. The first peak value (V1) and the second peak value (V2) refer to the hydrogen concentrations at peak points in the curve. Specifically, the first location with the first peak value (V1) is proximate to the second surface (S2) of the active layer 22, and the second location with the second peak value (V2) is distal to the second surface (S2) of the active layer 22. Moreover, the second peak value (V2) is greater than the first peak value (V1). That is, the hydrogen concentration at a location corresponding to the second peak value (V2) is greater than the hydrogen concentration at a location corresponding to the first peak value (V1). The hydrogen impurities (H) reach the first peak value (V1) at a location proximate to the second surface (S2) of the active layer 22. The higher concentration of hydrogen impurities (H) causes the p-type semiconductor layer 23 to generate a larger amount of holes, and facilitates the movement of holes in the p-type semiconductor layer 23 towards the active layer 22, so that recombination of holes with electrons within the active layer 22 is increased, thereby improving the light emission efficiency of the light-emitting device of this disclosure. Meanwhile, the hydrogen impurities (H) reach the second peak value (V2) at a location distal to the second surface (S2) of the active layer 22. The second peak value (V2) is greater than the first peak value (V1). In this embodiment, the hydrogen impurities (H) reach the second peak value (V2) at a location proximate to the fourth surface (S4). The higher concentration of hydrogen impurities (H) causes the p-type semiconductor layer 23 to have a lower electrical resistance around the fourth surface (S4). As such, the p-type semiconductor layer 23 may have a reduced contact resistance with subsequent material layers. Therefore, a thus formed light-emitting device may have a reduced starting voltage, thereby achieving high brightness and low operating voltage.

The first location with the first peak value (V1) is spaced apart from the second surface (S2) by a first distance (d1) in the thickness direction that ranges from 3 nm to 55 nm. If the first distance (d1) between the first location with the first peak value (V1) and the second surface (S2) is greater than 55 nm, the holes in the p-type semiconductor layer 23 cannot efficiently move to the active layer 22, which means that the light emission efficiency of the light-emitting device is not improved, since electron hole recombination efficiency is not enhanced in this configuration.

The first location with the first peak value (V1) is spaced apart from the second location with the second peak value (V2) by a second distance (d2) in the thickness direction that ranges from 50 nm to 150 nm. The second location with the second peak value (V2) is spaced apart from the second surface (S2) by a fifth distance (d5) in the thickness direction that is smaller than 150 nm. If the fifth distance (d5) between the second location with the second peak value (V2) and the second surface (S2) is greater than 150 nm, then the p-type semiconductor layer 23 is too thick, which may increase light absorption within certain layer(s) of the light-emitting device and thereby impact the light emission efficiency of the light-emitting device to a certain extent.

The first peak value (V1) ranges from 5E19 $cm^{-3}$ to 1E20 $cm^{-3}$, and the second peak value (V2) is greater than 1E20 $cm^{-3}$.

In addition, the concentration distribution of the hydrogen impurities (H) further may have a first minimum value (L1) at a third location between the first location with the first peak value (V1) and the first surface (S1), and a second minimum value (L2) at a fourth location between the first location with the first peak value (V1) and the second location with the second peak value (V2). The first minimum value (L1) is smaller than the second minimum value (L2). Each of the first minimum value (L1) and the second minimum value (L2) refers to respective hydrogen concentration at trough points on the concentration distribution curve of hydrogen impurities (H).

The fourth location with the second minimum value (L2) is spaced apart from the first location with the first peak value (V1) by a third distance (d3) in the thickness direction, and the fourth location with the second minimum value (L2) is spaced apart from the second location with the second peak value (V2) by a fourth distance (d4) in the thickness direction. In some embodiments, the third distance (d3) is greater than the fourth distance (d4). In some embodiments, the third distance (d3) between the fourth location with the second minimum value (L2) and the first location with the first peak value (V1) in the thickness direction is greater than the first distance (d1) between the first location with the first peak value (V1) and the second surface (S2) in the thickness direction. In some embodiments, the second minimum value (L2) is smaller than 1E19 $cm^{-3}$. In some embodiments, the first minimum value (L1) is smaller than 5E18 $cm^{-3}$.

The light-emitting device with the features and properties described above have high light emission efficiency and low operating voltage.

Figure 3:
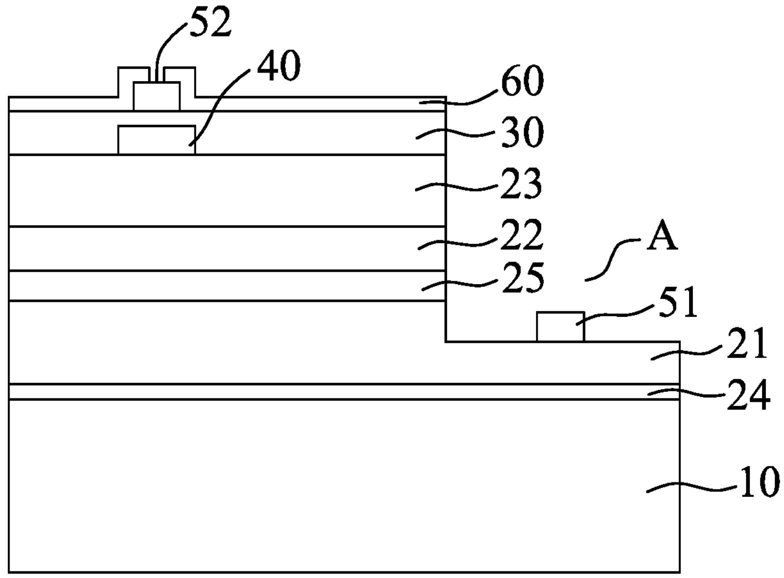
FIG. 3 is a schematic cross-sectional view illustrating another embodiment of a light-emitting device of this disclosure.

FIG. 3 is a schematic cross-sectional view illustrating another embodiment of a light-emitting device of this disclosure.

Referring to FIG. 3, the light-emitting device includes a substrate 10, a semiconductor laminate 20 on the substrate 10, a first electrode 51, and a second electrode 52. The first electrode 51 and the second electrode 52 are electrically connected to the semiconductor laminate 20.

In this disclosure, the substrate 10 is thick enough to support the semiconductor laminate 20 and other structure(s) provided thereon. The substrate may be made of a conductive material or an insulating material. The conductive material may be, for example, gallium arsenide (GaAs), indium phosphide (InP), silicon carbide (SiC), gallium phosphide (GaP), zinc oxide (ZnO), gallium nitride (GaN), aluminum nitride (AlN), germanium (Ge), or silicon (Si) or the like. The insulating materials may be a transparent material, for example, sapphire, silicon carbide (SiC), silicon nitride (SiN), glass, or the like. In the present embodiments, the substrate 10 is a transparent substrate made of sapphire. In some embodiments, the substrate 10 is a growth substrate upon which the semiconductor laminate 20 is formed by epitaxial growth via the metal organic chemical vapor deposition (MOCVD) technique. In other embodiments, the substrate 10 may be, instead of a growth substrate, a supporting substrate which supports the semiconductor laminate 20 that is transferred and bonded to the supporting substrate after formation. To improve the light-emitting efficiency of the substrate 10, the substrate may be further patterned to form a series of protruding or indented structures on a surface thereof.

The semiconductor laminate 20 in the present embodiment includes a buffer layer 24, an n-type semiconductor layer 21, a stress relief layer 25, an active layer 22, and a p-type semiconductor layer 23, as well as the first electrode 51 and the second electrode 52. The first electrode 51 and the second electrode 52 are electrically connected to the n-type semiconductor layer 21 and the p-type semiconductor layer 23, respectively. The n-type semiconductor layer 21 and the p-type semiconductor layer 23 have opposite conductivity types. The n-type semiconductor layer 21 is doped with an n-type dopant, such as silicon, and provides electrons. The p-type semiconductor layer 23 is doped with a p-type dopant, such as magnesium, and provides holes. In the active layer 22, electrons and holes recombine to emit light. The n-type dopant and the p-type dopant are not limited to the examples described above.

The buffer layer 24 is provided in order to reduce lattice mismatch between the substrate 10 and the n-type semiconductor layer 21. Therefore, the buffer layer 24 may have a lattice constant between that of the substrate 10 and that of the n-type semiconductor layer 21. The buffer layer 24 may be made of a material including $Al_pIn_qGa_{1-p-q}N$, where $0 \leq p \leq 1$, $0 \leq q \leq 1$. Specifically, the buffer layer 24 may be an AlN layer, a GaN layer, an AlGaN layer, an AlInSb layer, a InN layer or an InGaN layer. The buffer layer 24 may be formed via the MOCVD or a Physical Vapor Deposition (PVD) method.

The stress relief layer 25 is provided to release the stress generated during the growth of the n-type semiconductor layer 21, which may facilitate enhancing the brightness of the light-emitting device. The stress relief layer 25 may have a superlattice structure that is formed, for example, by alternately stacking an InGaN layer and a GaN layer. In one embodiment, the stress relief layer 25 may have a single-layered structure.

The active layer 22 is disposed between the n-type semiconductor layer 21 and p-type semiconductor layer 23, and maybe a homojunction structure, a heterojunction structure, a single-quantum-well structure, a multiple-quantum-well structure, or the like. In this embodiment, the active layer 22 includes quantum well sublayers 221 and quantum barrier sublayers 222 that are stacked alternately. The quantum well sublayers 221 are where electrons and holes recombine to emit light. The quantum barrier sublayers 222 have an energy level that is greater than that of the quantum well sublayer 221. The quantum barrier sublayers 222 act to confine electron hole recombination to take place within quantum well sublayers 221. The active layer 22 may have a quantum well sublayer 221 or a quantum barrier sublayer 222 that is closest to the n-type semiconductor layer 21. The active layer 22 may have a quantum well sublayer 221 or a quantum barrier sublayer 222 that is closest to the p-type semiconductor layer 23. Each quantum barrier sublayer 222 may be a nitride layer with or without aluminum, such as an AlGaN layer or a GaN layer, and may have a higher energy level. Each quantum barrier sublayer 222 may be an n-type doped layer or a non-doped layer substantially free of impurities. The quantum well sublayers 221 are typically a indium-containing nitride layer and may have a lower energy level, such as an InGaN layer.

In this embodiment, all the quantum barrier sublayers 222 may have a similar thickness, and all the quantum well sublayers 221 may have a similar thickness. In other embodiments, the quantum barrier sublayers 222 may have different thicknesses, and each of the quantum well sublayer 221 may have a thickness that may be adjusted to match that of a corresponding quantum barrier sublayer 222. The quantum barrier sublayer 222 that is closest to the p-type semiconductor layer 23 may be un-doped, and may be in a single-layered structure or in a multi-layered structure. For example, the single-layered structure may include a single layer of un-doped material, such as AlN, AlGaN or AlInGaN, and the multi-layered structure may include multiple layers of un-doped materials, such as u-GaN/u-AlGaN, u-InGaN/u-AlInSb/u-AlGaN or u-GaN/AlN.

The n-type semiconductor layer 21, the active layer 22, and the p-type semiconductor layer 23 may be formed by a process, for example but not limited to, metal-organic chemical vapor deposition (MOCVD), hydride vapor phase epitaxy (HVPE), liquid phase epitaxy (LPE), molecular beam epitaxy (MBE), or ion plating such as sputtering or evaporation.

In this embodiment, the semiconductor laminate 20 may be formed to have a recess (A) that extends from the p-type semiconductor layer 23 to the n-type semiconductor layer 21. The first electrode 51 is disposed on a surface of the n-type semiconductor layer 21 within the recess (A), and the second electrode 52 is disposed on a surface of the p-type semiconductor layer 23. As such, the first electrode 51 and the second electrode 52 are disposed on a same side of the substrate 10. In other embodiments, the electrodes 51 and the second electrode 52 may be respectively disposed on two opposite sides of the substrate 10.

The light-emitting device may further include a transparent conductive layer 30 between the second electrode 52 and the p-type semiconductor layer 23. The transparent conductive layer 30 may facilitate lateral diffusion of electric current from the second electrode 52 to the semiconductor layers, so that the n-type semiconductor layer 21 and the p-type semiconductor layer 53 may include electrons and holes. The transparent conductive layer 30 covers an upper surface of the p-type semiconductor layer 23. In other embodiments, the transparent conductive layer 30 may also cover a portion of an upper surface of the n-type semiconductor layer 21 that constitutes a bottom of the recess (A), further facilitating current spreading.

The transparent conductive layer 30 is made of a transparent conductive material, for example, one selected from the group consisting of indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), graphene, and combinations thereof, or other suitable transparent conductive oxide materials.

In some embodiments, the transparent conductive layer 30 covers at least 80% of an area of the upper surface of the p-type semiconductor layer 23. In certain embodiments, the transparent conductive layer 30 covers at least 90% of the area of the upper surface of the p-type semiconductor layer 23. The transparent conductive layer 30 may be formed by a plating process such as sputtering, and may be formed with various patterns by an etching process as needed. Moreover, after the plating process, high temperature annealing treatment may be performed for good ohmic contact between the transparent conductive layer 30 and the p-type semiconductor layer 23.

In addition, the light-emitting device may further include a current barrier layer 40 disposed between the first electrode 51 or the second electrode 52 and the p-type semiconductor layer 23. The current barrier layer 40 is formed of transparent insulating material(s), for example, one selected from the group consisting of silicon oxide, silicon carbide, silicon nitride, aluminum oxide and combinations thereof. In addition, the current barrier layer 40 may be formed as a distributed Bragg reflector (DBR). The current barrier layer 40 may block longitudinal current flow between the second electrode 52 and/or first electrode 51 and the p-type semiconductor layer 23. The current barrier layer 40 may be formed as a single piece or in multiple pieces in an annular shape, a circular shape or a square shape, depending on the actual requirements for current blocking.

The first electrode 51 and the second electrode 52 are adapted for connection to an external power supply, and inject currents from the external power supply to the light-emitting device. The first electrode 51 and the second electrode 52 may include a plurality of metal layers. The metal layers may include an ohmic contact layer, a reflective layer, a blocking layer and a wire bonding layer successively laminated in such order. The materials used for the plurality of metal layers may be selected from a group consisting of chromium, tungsten, aluminum, copper, platinum, gold, palladium, titanium, rhodium, and combinations thereof, or other suitable materials. The first electrode 51 and the second electrode 52 may be formed via PVD, chemical vapor deposition, atomic layer deposition, coating, sputtering, or other suitable techniques. Either the first electrode 51 or the second electrode 52 may include a pad portion and an extension portion. The extension portion facilitates lateral current spreading, so that the currents may distribute throughout the p-type semiconductor layer 23 as even as possible, thereby enhancing light emission efficiency and light emission uniformity of the light-emitting device.

Furthermore, the light-emitting device may include an insulating protective layer 60 as an outermost layer of the light-emitting device that covers a light-emitting surface of the light-emitting device. In the present embodiment, the insulating protective layer 60 covers an outer periphery of the second electrode 52 and a surface of the transparent conductive layer 30. In other embodiments, the insulating protective layer 60 may also cover inner surfaces exposed from the recess (A) around the first electrode 51 and outer surfaces of the light-emitting device. The insulating protective layer 60 has a refractive index that is lower than that of the transparent conductive layer 30 and that of the semiconductor laminate 20. The light emitted from the active layer 22 is thus easier to pass through the insulating protective layer 60 as much as possible after passing through the transparent conductive layer 30 or sidewalls of the light-emitting device, thereby improving the light emission efficiency. The insulating protective layer 60 may further provide moisture isolation and insulation protection to the outer surfaces of the light-emitting device including the transparent conductive layer 30 around the first and second electrodes 51, 52. The insulating protective layer 60 may be made of a material selected from silicon oxide, silicon carbide, silicon nitride, aluminum oxide, and combinations thereof, and may be formed as a distributed Bragg reflector.

In another embodiment of this disclosure, there is provided a light-emitting apparatus including the light-emitting device as described above.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, the one or more features may be singled out and practiced alone without the another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device comprising:

a semiconductor laminate, which includes an n-type semiconductor layer, a p-type semiconductor layer disposed on the n-type semiconductor layer, and an active layer disposed between the n-type semiconductor layer and the p-type semiconductor layer, and having a first surface (S1) proximate to the n-type semiconductor layer and a second surface (S2) proximate to the p-type semiconductor layer, the p-type semiconductor layer having a third surface (S3) proximate to the n-type semiconductor layer and a fourth surface (S4) distal to the n-type semiconductor layer;

wherein the semiconductor laminate further includes hydrogen impurities with a concentration distribution along a thickness direction from the n-type semiconductor layer to the p-type semiconductor layer, the concentration distribution having a first peak value (V1) at a first location proximate to the active layer and a second peak value (V2) at a second location distal to the active layer, the second peak value (V2) being greater than the first peak value (V1).

2. The light-emitting device as claimed in claim 1, wherein the first location with the first peak value (V1) is spaced apart from the second surface (S2) by a first distance (d1) in the thickness direction that ranges from 3 nm to 55 nm.

3. The light-emitting device as claimed in claim 1, wherein the first location with the first peak value (V1) is spaced apart from the second location with the second peak value (V2) by a second distance (d2) in the thickness direction that ranges from 50 nm to 150 nm.

4. The light-emitting device as claimed in claim 1, wherein the first peak value (V1) ranges from 5E19 $cm^{-3}$ to 1E20 $cm^{-3}$.

5. The light-emitting device as claimed in claim 1, wherein the second peak value (V2) is greater than 1E 20 $cm^{-3}$.

6. The light-emitting device as claimed in claim 1, wherein the concentration distribution of the hydrogen impurities (H) further has a first minimum value (L1) at a third location between the first location with the first peak value (V1) and the first surface (S1), and a second minimum value (L2) at a fourth location between the first location with the first peak value (V1) and the second location with the second peak value (V2), the first minimum value (L1) being smaller than the second minimum value (L2).

7. The light-emitting device as claimed in claim 6, wherein the fourth location with the second minimum value (L2) is spaced apart from the first location with the first peak value (V1) by a third distance (d3) in the thickness direction, and the fourth location with the second minimum value (L2) is spaced apart from the second location with the second peak value (V2) by a fourth distance (d4) in the thickness direction, the third distance (d3) being greater than the fourth distance (d4).

8. The light-emitting device as claimed in claim 7, wherein the third distance (d3) is greater than a first distance (d1) between the first location with the first peak value (V1) and the second surface (S2) in the thickness direction.

9. The light-emitting device as claimed in claim 6, wherein the second minimum value (V2) is smaller than 1E19 $cm^{-3}$.

10. The light-emitting device as claimed in claim 6, wherein the first minimum value (V1) is smaller than 5E18 $cm^{-3}$.

11. The light-emitting device as claimed in claim 1, wherein the second location with the second peak value (V2) is spaced apart from the second surface (S2) by a fifth distance (d5) in the thickness direction that is smaller than 150 nm.

12. The light-emitting device as claimed in claim 1, further comprising a first electrode and a second electrode electrically respectively connected to the n-type semiconductor layer and the p-type semiconductor layer.

13. The light-emitting device as claimed in claim 12, further comprising a substrate, the first electrode and the second electrode being disposed on a same side of the substrate.

14. The light-emitting device as claimed in claim 12, further comprising a substrate, the first electrode and the second electrode being respectively disposed on two opposite sides of the substrate.

15. The light-emitting device as claimed in claim 12, further comprising a transparent conductive layer disposed between the second electrode and the p-type semiconductor layer.

16. The light-emitting device as claimed in claim 15, wherein the transparent conductive layer covers an upper surface of the p-type semiconductor layer.

17. The light-emitting device as claimed in claim 16, wherein the transparent conductive layer covers at least 80% of an area of the upper surface of the p-type semiconductor layer.

18. The light-emitting device as claimed in claim 15, wherein the transparent conductive layer further covers a portion of an upper surface of the n-type semiconductor layer.

19. The light-emitting device as claimed in claim 12, further including a current barrier layer disposed between the second electrode and the p-type semiconductor layer.

20. A light-emitting apparatus comprising the light-emitting device as claimed in claim 1.

* * * * *